United States Patent [19]

Maeda et al.

[11] Patent Number: 5,302,209
[45] Date of Patent: Apr. 12, 1994

[54] APPARATUS FOR MANUFACTURING SEMICONDUCTOR DEVICE

[75] Inventors: Kazuo Maeda; Kouichi Ohira; Mitsuo Hirose, all of Tokyo, Japan

[73] Assignees: Semiconductor Process Laboratory Co., Ltd.; Canon Sales Co., Inc.; Alcan-Tech Co., Inc., all of Japan

[21] Appl. No.: 930,709
[22] PCT Filed: Feb. 12, 1992
[86] PCT No.: PCT/JP92/00135
§ 371 Date: Oct. 27, 1992
§ 102(e) Date: Oct. 27, 1992
[87] PCT Pub. No.: WO92/15114
PCT Pub. Date: Sep. 3, 1992

[30] Foreign Application Priority Data

Feb. 15, 1991 [JP] Japan .................................. 3-22358

[51] Int. Cl.$^5$ .................................. C23C 16/00
[52] U.S. Cl. .................... 118/719; 118/725; 118/729; 118/730; 156/345
[58] Field of Search ........... 118/719, 725, 729, 730; 156/345

[56] References Cited

U.S. PATENT DOCUMENTS 3,233,578 2/1966 Capita ................................. 118/725
3,456,616 7/1969 Glem ................................. 118/725
3,717,439 2/1973 Sakai ................................. 118/725

FOREIGN PATENT DOCUMENTS 63-76334  4/1988  Japan .
4-145623  5/1992  Japan .
4-180226  6/1992  Japan .
4-137613 12/1992  Japan .

Primary Examiner—Richard Bueker
Attorney, Agent, or Firm—Lorusso & Loud

[57] ABSTRACT

A continuous type automated apparatus for manufacturing a semiconductor device by forming a film on a wafer by a CVD method. The apparatus moves the wafer while maintaining the wafer at a predetermined temperature, and controls production of individual wafers and formation of multi-layer films of different types. The apparatus includes a wafer holder, a rotary shaft for supporting the wafer holder so that wafer loading surfaces of the wafer holder rotate in a circle within a single plane. A gas dispersion unit is provided separate from the wafer holder and facing the wafer loading surface of the wafer holder. A first pair of contacts are electrically connected to a heater and are mounted on the rotary shaft and a second pair of contacts are connected to a power source are in sliding contact with the first pair of contacts so that the rotation of the rotary shaft is not obstructed. This apparatus is useful as a continuous type automated CVD apparatus.

8 Claims, 11 Drawing Sheets

APPARATUS FOR MANUFACTURING SEMICONDUCTOR DEVICE

BACKGROUND OF THE INVENTION

1. Field of the Invention

The present invention relates to a continuous type automated apparatus for manufacturing a semiconductor device for forming a film on a wafer by a chemical vapor deposition (CVD) method.

2. Related Art

The CVD method, on a mass production scale, uses one of the following types of apparatus:
(1) batch type CVD apparatus,
(2) continuous CVD apparatus including;
   (a) conveyor type,
   (b) walking beam type, and
(3) multi-chamber type CVD apparatus.

The batch type CVD apparatus has a high mass-productivity, but is not suitable for a process increasing the diameter of a wafer or requiring precise production control of individual wafers. Moreover, its throughput is not high because of slow processing speed.

Further, a multi-chamber type CVD apparatus as shown in FIG. 11(c) is principally used for film formation under reduced pressure, and respective chambers are independent of one another. Therefore, various different processes are possible and flexibility is high, but the throughput is appreciably low.

Accordingly, when increase of the diameter of the wafer, high throughput and the like are required, the continuous type CVD apparatus is advantageous.

FIG. 10(a) illustrates a conveyor type continuous CVD apparatus, which is used principally for film formation under atmospheric pressure. Reference numeral 1 represents a conveyor belt, 2 represents a heater provided under the conveyor belt on which a film is formed on a wafer. Heater 2 is separated from the conveyor belt 1 and is stationary. A gas dispersion unit 3 is provided above the conveyor belt 1 and 4a and 4b represent cassette stations of a loader section and an unloader section. In such an apparatus, wafers are placed on the conveyor belt 1 and processed one after another. Further, since the heater 2 is installed stationary under the conveyor belt 1, the wafers are heated indirectly by radiation.

FIG. 10(b) illustrates a continuous type CVD apparatus of a walking beam system, which is used principally for film formation by a plasma CVD method and the like under reduced pressure. Reference number 5 represents a chamber, and 6a to 6h represent a plurality of wafer loading tables each equipped with a heater which are fixed to a base table 11. 7a to 7h represent eight walking beams arranged rotatably around the rotary shaft for holding the wafers, 8a and 8b represent gate valves, 9 represents a load lock chamber connected to the chamber 5 through gate the valve 8a, and 10 represents a cassette chamber connected to the load lock chamber 9 through the gate valve 8b.

To form a film on a wafer, a wafer is first loaded on the wafer loading table 6a in the chamber 5 from the load lock chamber 9, and heated to a predetermined temperature by means of a heater located underneath the wafer loading table 6a. Then, the wafer is held by the walking beam 7a after forming a film on the wafer located on the wafer loading table 6a, and is moved and loaded on the wafer loading table 6b where an additional film is formed. At this time, the next wafer is also loaded on the wafer loading table 6a in the chamber 5 from the load lock chamber 9, and heated to a predetermined temperature by a heater located underneath the wafer loading table 6a. Then, films are formed on the wafers at both wafer loading tables 6a and 6b.

The wafers are introduced into the chamber 5 in consecutive order in this manner, and films are formed continuously on the surfaces of the heated wafers at respective wafer loading tables 6a to 6h while moving the wafers in succession along fixed wafer loading tables 6a to 6h one after another. Accordingly, when a wafer completes a cycle from loading table 6a to loading table 6h, films of different types are formed as multiple layers or a film of a single layer having a predetermined film thickness is formed.

The above-described continuous type CVD apparatus has the following problems.
(1) With the conveyor type, since the wafer moves and the heater 2 is fixed, it is difficult to measure the temperature of the wafer. Moreover, since the heater 2 underneath the conveyor belt 1 is installed apart from the conveyor belt 1 in some measure, it is impossible to control the temperature of the wafer precisely.
(2) Also, as to the walking beam type, since the wafer is lifted from the wafer loading tables 6a to 6h while moving, it is unavoidable that the temperature of the wafer is lowered. Thus, the wafer is subject to a temperature cycle midway in film formation, and the film is sometimes thereby distorted. Since it is required to heat the wafer again so that the wafer temperature reaches a predetermined temperature when the wafer moves from the wafer loading table 6a to the next wafer loading table 6b, it takes time to stabilize the wafer temperature, thus complicating temperature adjustment.

One solution to the foregoing might be to use a wafer holder fixed in position and equipped with a heater, in conjunction with a movable gas dispersion unit. However, it would no longer be possible to process the wafers continuously because the wafers do not move.

Therefore, it is an object of the present invention to solve the foregoing problems by providing an apparatus for manufacturing a semiconductor device in which the wafer can be moved while maintaining the wafer temperature at a predetermined temperature with which it is possible to control processing of each individual wafer and form multi-layer films of different types.

SUMMARY OF THE INVENTION

The apparatus for manufacturing a semiconductor device of the present invention includes a wafer holder equipped with wafer loading surfaces, a rotary shaft for holding the wafer holder so that the wafer loading surfaces rotate in a circle in a single plane, and a gas dispersion unit associated with each of the wafer loading surfaces of the wafer holder and spaced from the wafer holders. Each wafer holder is equipped with a heater and a first pair of contacts electrically connected to the heater, are provided on the rotary shaft. A second pair of contacts connected to a power source are provided in sliding contact with the first pair of contacts so that the rotation of the rotary shaft is not obstructed. With this arrangement, it is possible to move the heater together with the wafer while electric power is being supplied to the heater. Accordingly, if the wafer temperature is set at a predetermined temperature at the beginning, it is not required to readjust the wafer temperature until the film formation is complete. Therefore, the wafer temperature is stabilized, thus making it possible to improve the accuracy of the temperature for film formation.

In a second type embodiment, the wafer holder has a disc configuration, and provides a plurality of wafer loading surfaces around the circumference of the disc. Since it is possible to move the wafer on what is called an endless track, it is possible to form films continuously or intermittently and to maintain a high throughput.

In a third type embodiment, the wafer holder is composed of a plurality of wafer loading tables provided separately from one another, and each of the wafer loading tables provides a wafer loading surface, and arranged in a circle around the rotary shaft. With this, it becomes possible to control production of individual wafers and formation of multi-layer films of different types, and to perform film formation with flexibility.

In a fourth type embodiment, the apparatus includes means for rotating the wafer holder around an axis perpendicular to a wafer loading surface at a position where the wafer is held as the center, or means for reciprocably moving the wafer holder in a straight line radially of the axis. With this fourth type embodiment, even in a case there is a deviation in the supply of reaction gas to one surface, the supply of the reaction gas to the wafer remains uniform. Thus, it is possible to form a film having uniform film thickness and film quality on the wafer.

In a fifth type embodiment, the gas dispersion unit includes a plurality of gas collectors installed separately from one another, and has means for supplying reaction gas independently to the respective gas collectors. Thus, it becomes possible to control production of individual wafers and formation of multi-layer films of different types similarly to the case wherein a plurality of wafer loading tables constitute the wafer holder and are provided separately from one another.

DESCRIPTION OF THE PREFERRED EMBODIMENTS

Embodiments of the present invention will be described hereinafter with reference to the drawings.

(1) The First Embodiment

Figure 1:
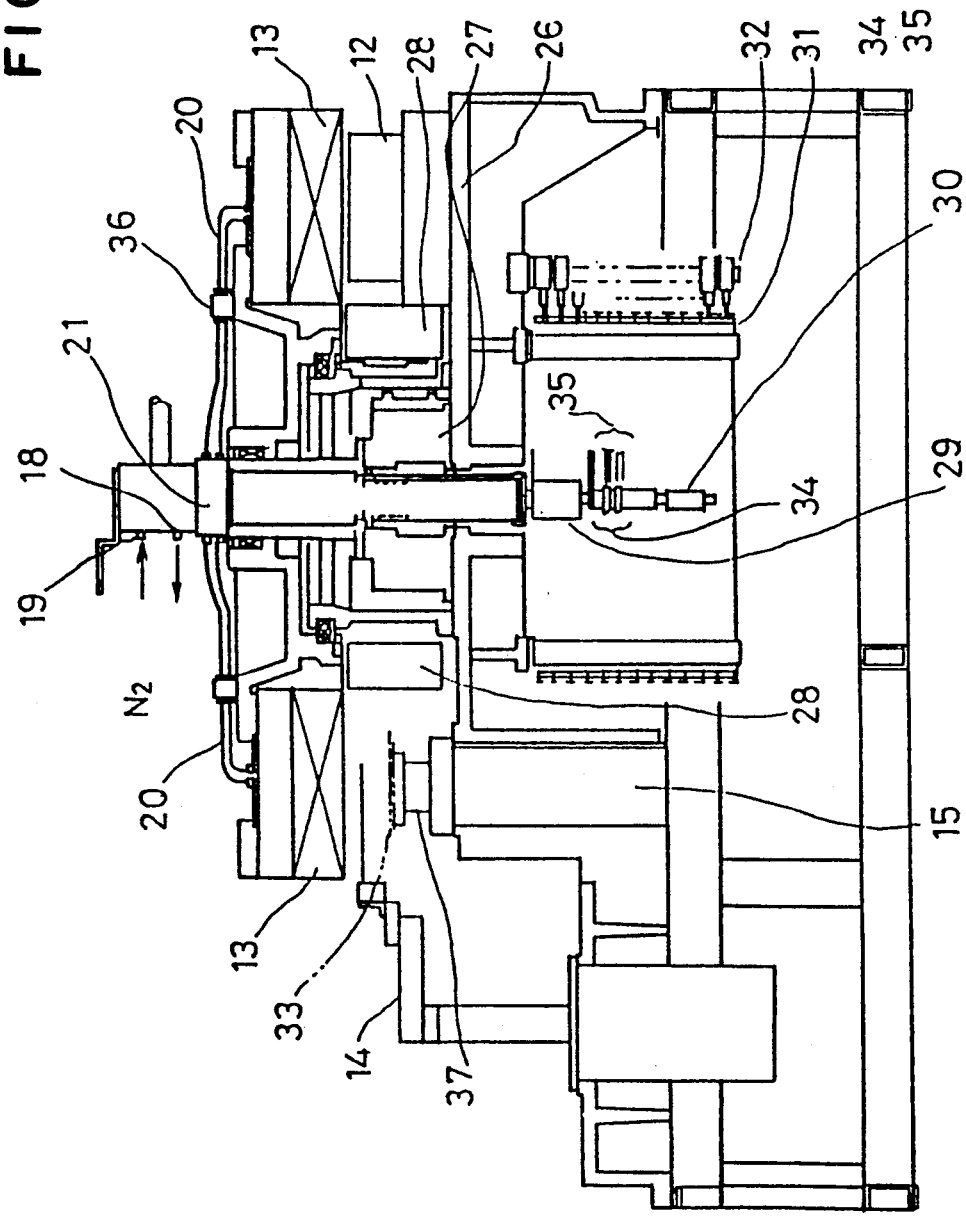
FIG. 1 is a structural view of a CVD apparatus according to a first embodiment of the present invention.
Figure 2:
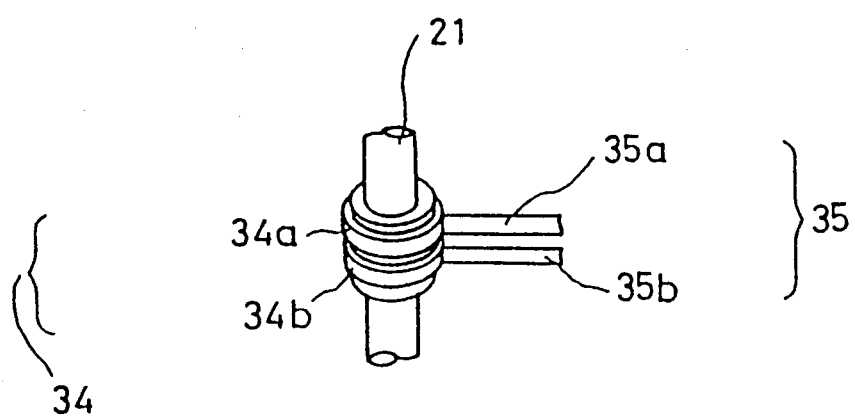
FIG. 2 is a perspective view showing the detail of an electric contact for supplying electric power to a heater, provided on a rotary shaft of a CVD apparatus according to the first embodiment of the present invention.

FIG. 1 and FIG. 2 are structural views showing the general configuration of a CVD apparatus according to the first embodiment of the present invention, wherein FIG. 1 is a side view and FIG. 2 is a perspective view showing the detail of an electric contact for supplying electric power to a heater, provided on a rotary shaft.

In FIG. 1, reference numeral 14 represents a robot for conveying a wafer to a loader/unloader section 15 and/or carrying the wafer out of the loader/unloader section 15. Robot 14 moves rotatably and vertically. The loader/unloader section 15 of the CVD apparatus loads the conveyed wafer on an elevator 37, moves vertically and rotatably, and loads the wafer on a wafer loading surface of an individual wafer holder 13e as required and unloads the wafer complete with a film formed thereon from the wafer loading surface as required.

A wafer holder 13 provides a wafer loading surface to which a wafer is fixed and released, as required, by means of a chuck provided with a suction port 18 and a nitrogen gas inlet port 19 connected to an exhauster (not illustrated) through a pipe-shaped arm 20. Also, a heater is buried in the wafer loading table 13 so as to heat and thermally insulate the loaded wafer. 21 represents a rotary shaft integrally formed with the wafer holders 13 which are fixed to the rotary shaft 21 by means of arms 20. The wafer loading surfaces rotate around the rotary shaft 21 in one plane by rotating the rotary shaft 21.

Gas dispersion units 12 are installed so as to face the wafer loading surfaces of the wafer holders 13. The gas dispersion units 12 are provided separately from the wafer holders 13, and are fixed to a base 26 of the apparatus. The rotary shaft 21, which supports the wafer holder 13 from its upper end, is rotatably supported in the central part of the base 26 and its lower end is housed inside the base 26.

27 represents a motor, e.g., a direct drive motor, for rotating the rotary shaft 21, and 28 represents oscillation units for moving the wafer holders 13 in reciprocating and straight-line motion, at periodic intervals, in a radial direction with respect to the rotary shaft 21 as the center with the position where the wafer holder 13 is held as reference. Joint sections 36 of the arms 20 expand and contract in accordance with the reciprocating, straight-line motion. A slip ring 29 is provided at the lower end of the rotary shaft 21 for transmitting an electric signal to a solenoid valve for changing over the suction port 18 to and from the inlet port 19. A slip ring 30 receives a signal from a thermocouple for measuring the temperature of the heater. 31 represents a slip ring in contact with a collector ring 32 connected to a power source (not illustrated) for supplying d.c. or a.c. power to the heaters of the wafer holders 13 which rotate together with the rotary shaft 21. Slip ring 31 is also connected to a pair of collector rings 35a and 35b in sliding contact with a pair of slip rings 34a and 34b which have corresponding positive/negative polarities and which are fixed to the rotary shaft 21 and rotate together with the rotary shaft 21 as shown in FIG. 2. Because, a plurality of heaters are provided individually, it is also possible to provide plural pairs of slip rings 34 on the rotary shaft 21 corresponding to respective heaters. Further, a rotary connector may be employed with any one of slip rings 29, 30, 34a and 34b so that the rotation of the rotary shaft 21 is not obstructed.

According to the first embodiment of the present invention as described above, the wafer holder 13 is equipped with a heater, and a pair of collector rings 35a and 35b connected to a power source are brought into contact with the pair of slip rings 34a and 34b connected to the heater and rotating together with the rotary shaft 21 so that the rotation of the rotary shaft 21 is not obstructed.

Thus, since the wafer can be moved on what is called an endless track, it is possible to form films continuously or intermittently and to maintain a high throughput. Further, the heater can be moved while electric power is being supplied to the heater. Therefore, if the wafer temperature is set at a predetermined temperature at the beginning, readjustment is not required until the film formation is complete. Accordingly, the wafer temperature is stable, thus making it possible to improve the accuracy of the temperature for film formation.

(2) The Second to the Ninth Embodiments

FIGS. 7(a) to (d) and FIGS. 8(e) to (h) are schematic perspective views collectively illustrating configurations of gas dispersion units/wafer holders of CVD apparatus according to the second to the ninth embodiments of the present invention, respectively.

FIG. 7 shows different versions of a CVD apparatus having wafer loading surfaces facing downward. FIG. 7(a) illustrates individual gas dispersion units 12a in combination with individual wafer holders 13a. FIG. 7(b) illustrates a block gas dispersion unit 12b in combination with a block wafer holder 13b. FIG. 7(c) illustrates a block gas dispersion unit 12c in combination with individual wafer holders 13c. FIG. 7(d) illustrates individual gas dispersion units 12d in combination with a block wafer holder 13d.

FIG. 8 shows different versions of a CVD apparatus having a wafer loading surface facing upward. FIG. 8(e) illustrates individual gas dispersion units 12e in combination with individual wafer holders 13e. FIG. 8(f) illustrates block gas dispersion units 12f in combination with a block wafer holder 13f. FIG. 8(g) illustrates a block gas dispersion unit 12g in combination with individual wafer holder 13g. FIG. 8(h) illustrates individual gas dispersion units 12h in combination with a block wafer holder 13h.

Different CVD apparatus having various combinations of above-mentioned gas dispersion units/wafer holders will be described in detail hereinafter.

(a) The Second Embodiment

Figure 3A:
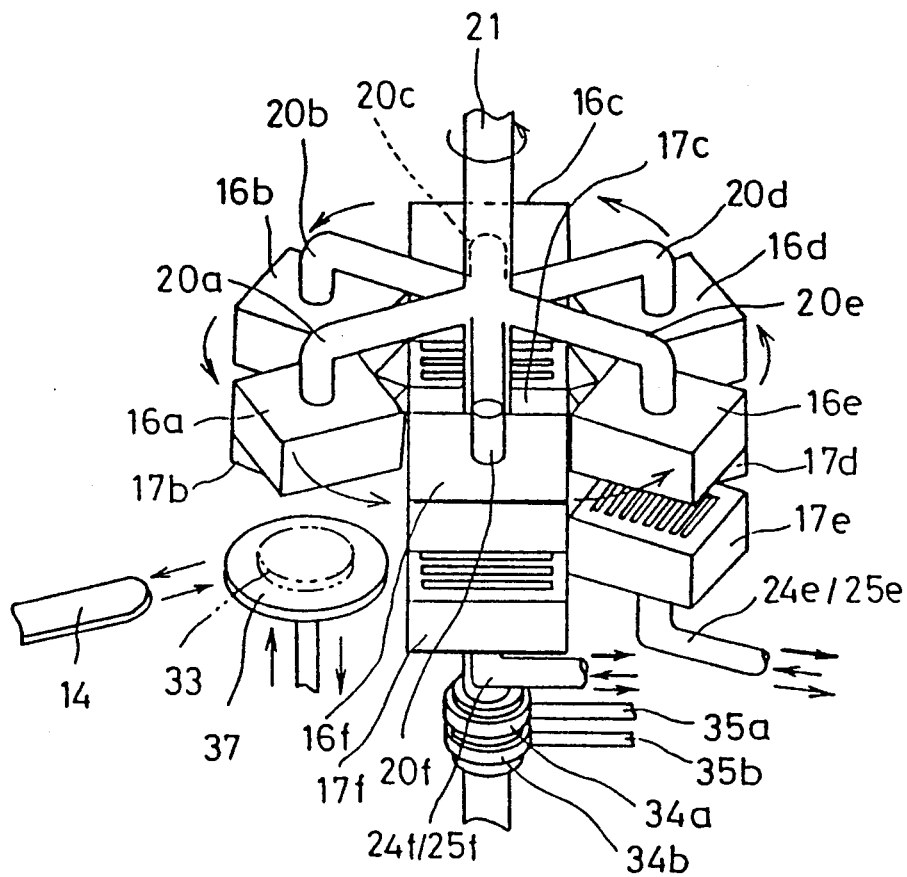
FIG. 3a is a perspective view showing the details of a combination gas dispersion unit and wafer holder in a second embodiment of the present invention and FIG. 3(b) is a side elevation of same.
Figure 3B:
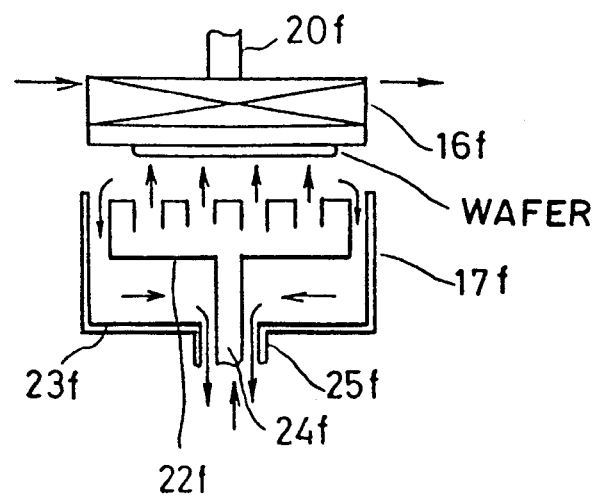
Figure 4:
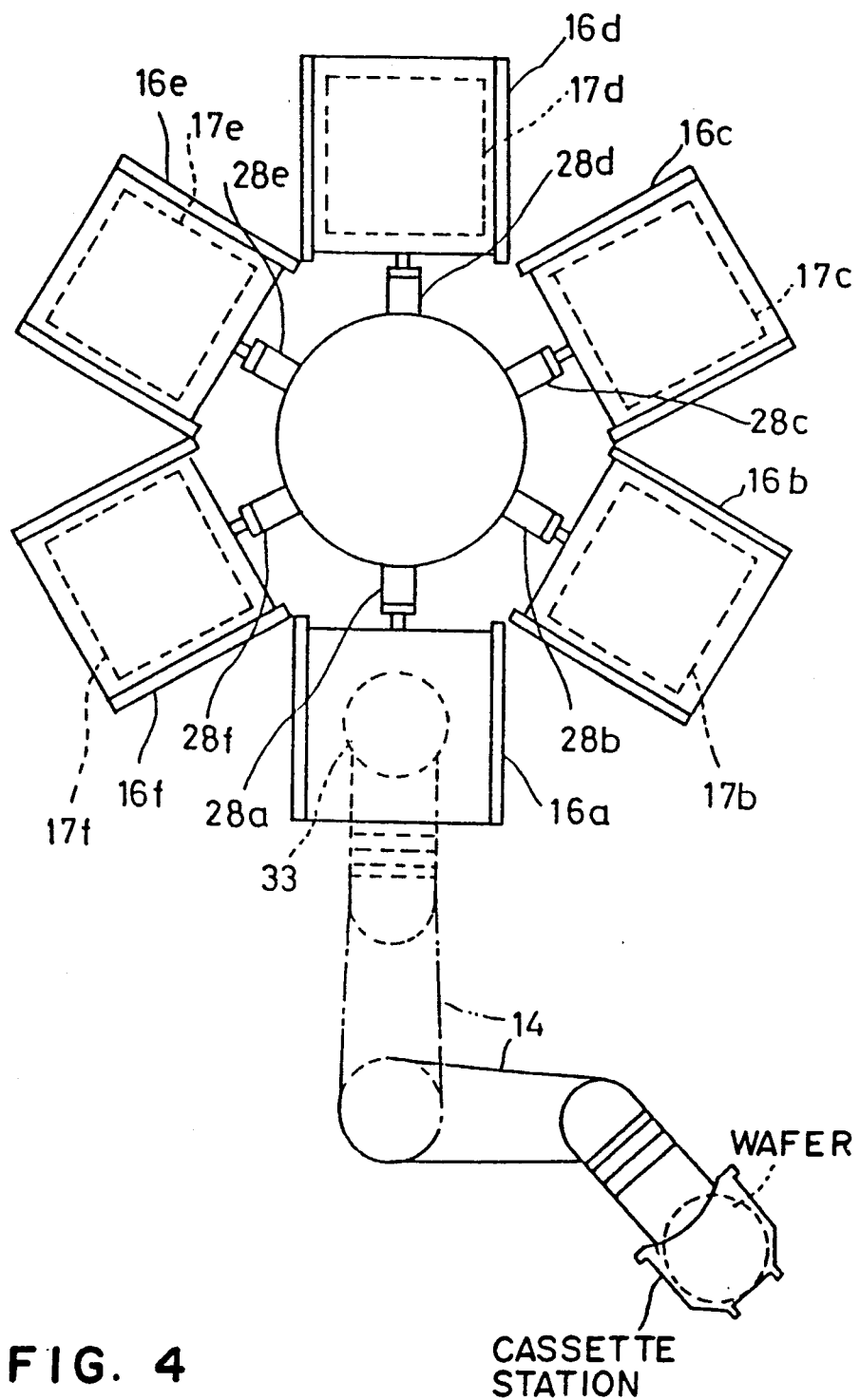
FIG. 4 is a plan view of the wafer holder of the second embodiment of the present invention.
Figure 5:
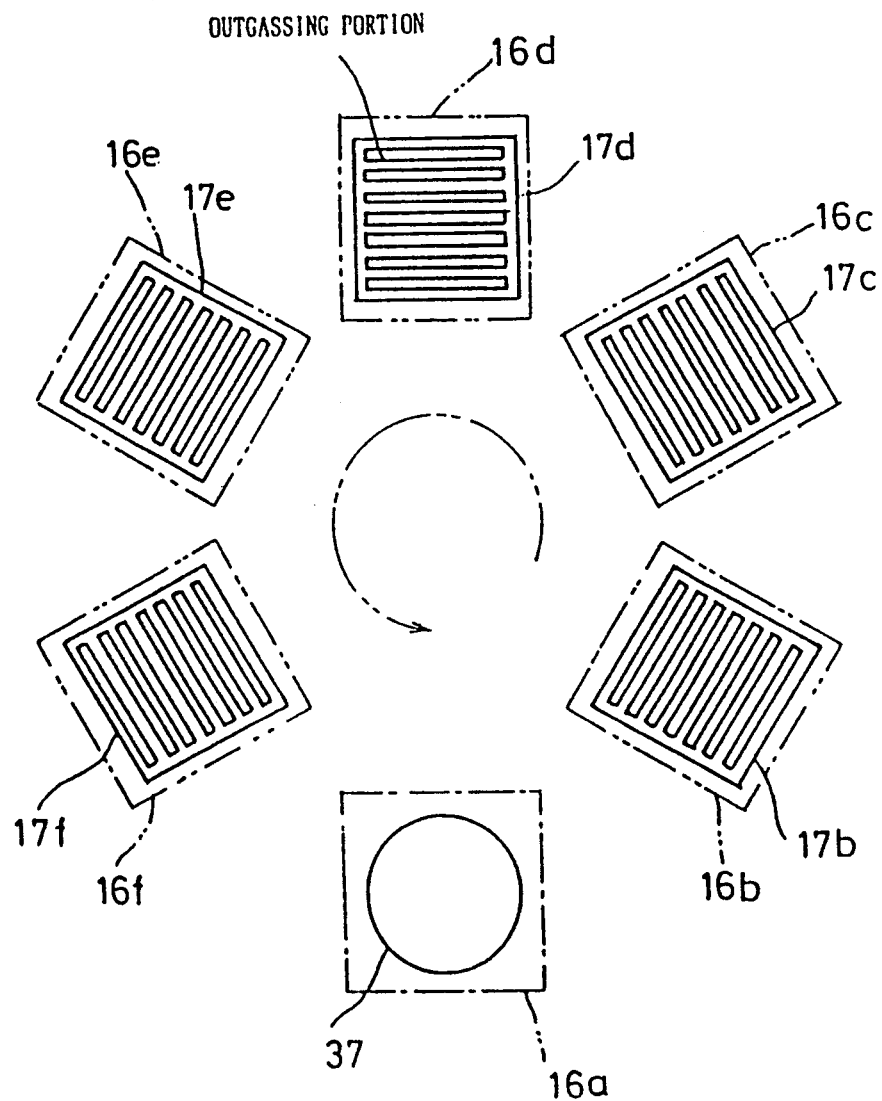
FIG. 5 is a plan view of the gas dispersion unit of the second embodiment of the present invention.

FIG. 3 to FIG. 5 are perspective views illustrating configurations of the gas dispersion units 17b–17f and wafer holders 16a–16f in the second embodiment of the present invention. FIGS. 3(a) and (b) show individual gas dispersion units 17b–17f and individual wafer holders 16a–16f arranged as in FIG. 7(a). FIG. 4 is a top view of the individual wafer holders 16a–16f and FIG. 5 is a top view of individual gas dispersion units 17b–17f.

Figure 7A:
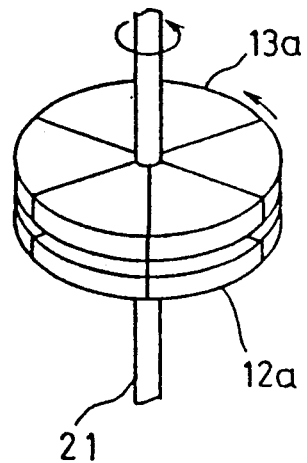
FIGS. 7(a), 7(b), 7(c) and 7(d) are a series of perspective views providing schematic configurations for the combined gas dispersion unit and wafer holder of the second to the fifth embodiments of the present invention.
Figure 7B:
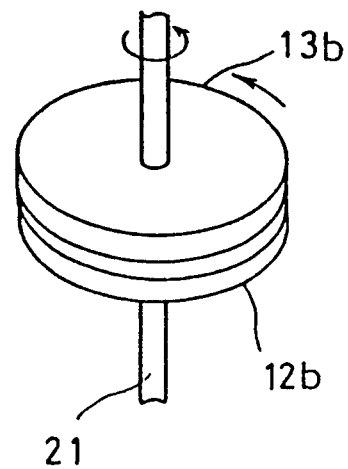

In FIGS. 3(a) and (b), 16a to 16f are separate wafer loading tables which together constitute the wafer holder 13a shown in FIG. 7(a). The wafers are fixed onto the wafer loading surface and/or unloaded therefrom by means of chucks communicating with the suction port 18 and the nitrogen gas inlet port 19 shown in FIG. 1, both connected with an exhauster (not illustrated) through pipe arms 20a to 20f.

Further, heaters are individually buried in respective wafer loading tables 16a to 16f so that electric power may be supplied to respective heaters independently so as to heat and thermally insulate the wafers loaded on respective wafer loading tables 16a to 16f. Respective wafer loading tables 16a to 16f are fixed to the rotary shaft 21 by means of the arms 20a to 20f. Also, the wafer loading surfaces are arranged so as to rotate with the rotary shaft 21 in a single plane.

Outgassing units 17b to 17f face wafer loading surfaces of the wafer loading tables 16a to 16f, which are provided separately from the wafer loading tables 16a to 16f and are fixed to the base 26 shown in FIG. 1. Further, respective outgassing units 17b to 17f have gas dispersing nozzles 22b to 22f for supplying the reaction gas to the wafers and gas collectors 23b to 23f for gathering the gas after contact with wafer loading surfaces, as illustrated with outgassing unit 17f in FIG. 3(b). Reaction gas inlet ports 24b to 24f are connected to the gas nozzles 22b to 22f and gas exhaust ports 25b to 25f are connected to the gas collectors 23b to 23f.

Slip ring 31 in FIG. 1 connects a power source to a pair of collector rings 35a and 35b which are in contact with positive and negative polarity slip rings 34a and 34b which are provided on the rotary shaft 21 and rotate therewith. While only the slip rings 34a and 34b connected to the heater of the wafer loading table 16a are shown in FIG. 3(a), slip rings connected to the heaters of the other wafer loading tables 16b to 16f are also provided on the rotary shaft 21. Further, a rotary connector is employed in association with each of slip rings 29, 30, 34a and 34b so that the rotation of the rotary shaft 21 is not obstructed.

As shown in FIG. 4, oscillation units 28a to 28f are provided separately from the base 26 and rotate with the rotary shaft 21. These oscillation units 28a to 28f move the wafer loading tables 16a to 16f in a radial direction with the rotary shaft 21 as the center, i.e. reciprocating straight-line movement. In FIG. 3 the wafer loading table 16a is positioned above the loader/unloader 15 where the elevator 37 is installed as shown in FIG. 1, and a wafer is delivered from the robot 14, but no film is formed.

In FIG. 5, 17b to 17f represent outgassing units provided facing the wafer loading tables 16a to 16f shown in FIG. 4. The outgassing units are fixed along a circumference with the rotary shaft 21 as the center. Gas dispersing nozzles have a plurality of slits arranged perpendicular to the radial direction with the rotary shaft 21 as the center.

With the apparatus of the second embodiment as described above, it becomes possible to control production of individual wafers and to control formation of multi-layer films of different types by providing a plurality of wafer loading tables 16a to 16f and outgassing units 17b to 17f which are mutually separated.

Further, respective wafer loading tables 16a to 16f reciprocate with straight-line movement individually in one plane in a direction perpendicular to the array of slit-form outgassing portions. Accordingly, even when there is a deviation in the supply of the reaction gas in one outgassing unit 17b..., or in an outgassing surface of 17f, the supply of the reaction gas to the wafer is made uniform, thus making it possible to form a film having uniform film thickness and film quality on the wafer.

The above-described second embodiment includes a wafer loading surface facing downward, but the present invention is also applicable to a wafer loading surface facing upward as shown in FIG. 8(c) as the fourth embodiment.

Figures 9A, 9B, 9C:
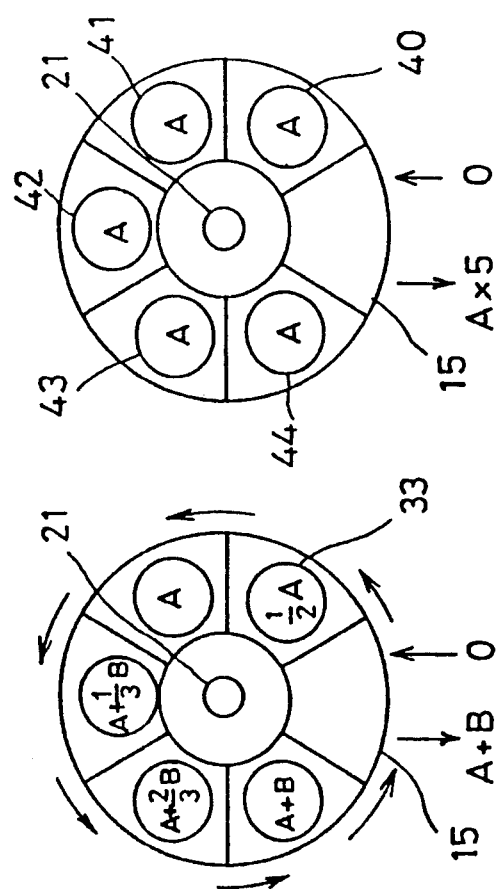
FIGS. 9(a), 9(b) and 9(c) are a series of schematic diagrams explaining the method for manufacturing a semiconductor device using a CVD apparatus in an embodiment of the present invention.
Figure 10A:
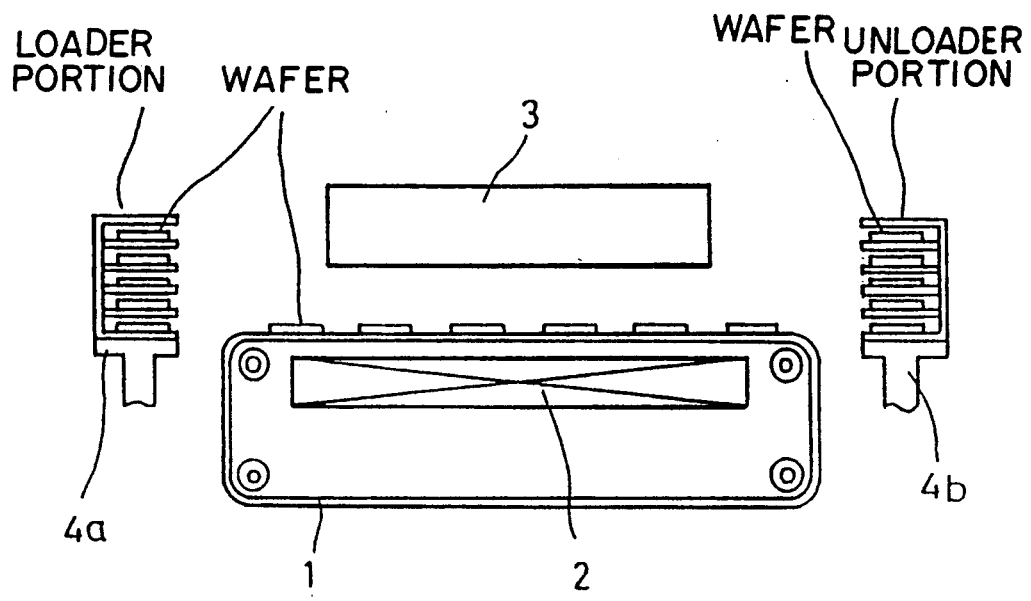
FIG. 10(a) is an elevational view of a conventional CVD apparatus.
Figure 10B:
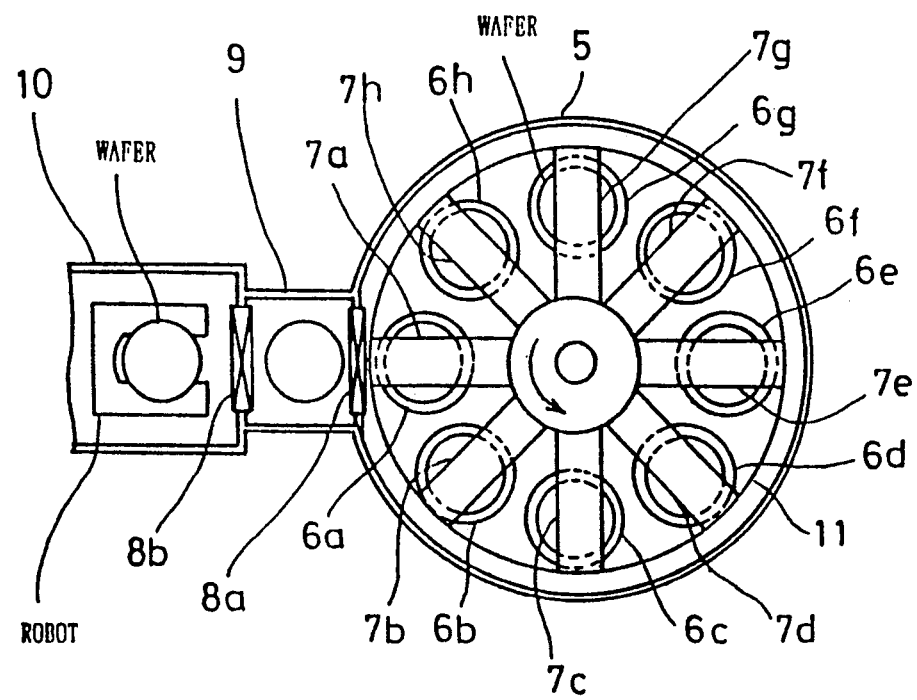
FIG. 10(b) is a plan view of another conventional CVD apparatus.
Figure 11:
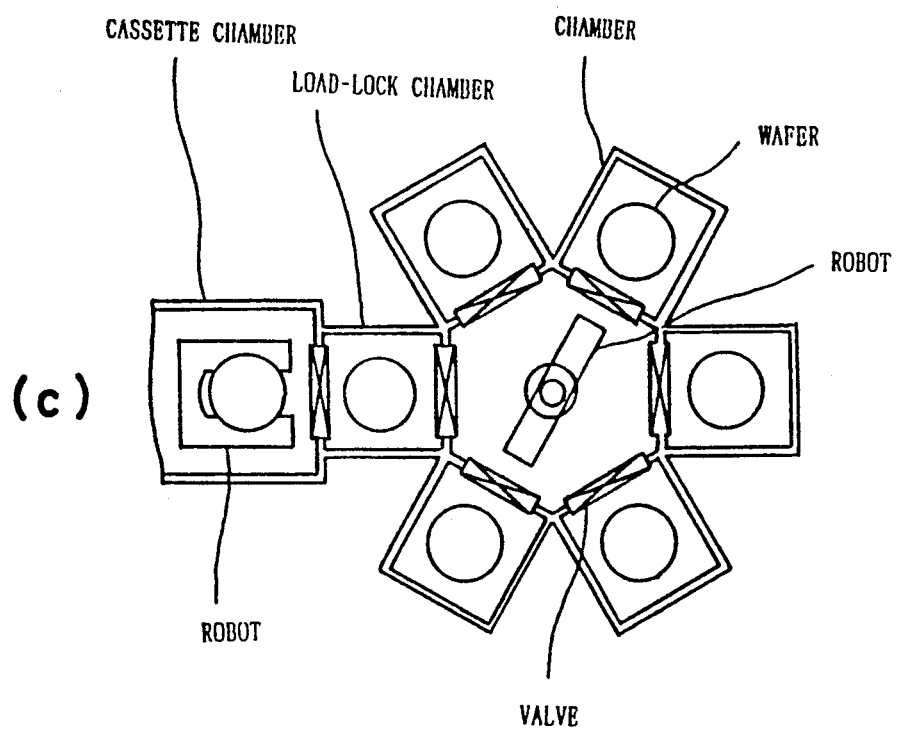
FIG. 11 is a plan view of another conventional CVD apparatus.

Next, a method for forming an insulating film composed of two layers by using the CVD apparatus shown in FIG. 1 having above-described individual gas dispersion unit 12a/individual wafer holder 13a will be described with reference to FIG. 1 to FIG. 4 and FIG. 9(c). In this case, an insulating film composed of two layers of CVD $SiO_2$ film/PSG film having a predetermined film thickness is formed on the wafer 33 while the individual wafer holder 13a rotates around the rotary shaft 21 as shown in FIG. 9(a). In FIG. 9(c), A indicates a predetermined film thickness of a CVD $SiO_2$ film formed on the wafer 33, and B indicates a predetermined film thickness of a PSG film.

First, the first wafer 33 is transported to the loader-/unloader 15 from the cassette station and loaded on the elevator 37 by means of the robot 14.

Then, the elevator 37 is lifted so as to have the first wafer 33 come in contact with the wafer loading surface of the wafer loading table 16a shown in FIG. 3(a), gas is exhausted through the suction port 18, a signal is transmitted to the slip ring 29 corresponding to the chuck of the wafer loading table 16a, and the solenoid valve is opened so as to load and fix the first wafer 33 onto the wafer loading surface by means of the chuck. At this time, electric power is supplied to the heaters of all the wafer loading tables 16a to 16f through the collector rings 35a, 36b, ... corresponding to the heaters of respective wafer loading tables 16a to 16f, thereby maintaining the temperature of the wafer loading surfaces of all the wafer loading tables 16a to 16f at approximately 350° C.

Next, after the temperature of the first wafer 33 reaches approximately 350° C., the rotary shaft 21 is rotated and the wafer loading table 16a is stopped at a position immediately above the outgassing unit 17f, and at the same time, a mixed gas of TEOS-$O_3$ is discharged from the gas nozzle 22f as the reaction gas. At this time, the thickness of the $SiO_2$ film reaches approximately 2,000 Å, and a $SiO_2$ film having a film thickness of approximately 2,000 Å, which is about half of a target film thickness, is formed on the first wafer 33. Further, since the wafer loading table 16a reciprocates radially in a straight line with a position where it is held as the center during film formation, the reaction gas is supplied uniformly onto the first wafer 33 and the film thickness and the film quality of the formed $SiO_2$ film becomes uniform. In the meantime, the second wafer is loaded on the wafer loading table 16b located at the loader/unloader 15 as described above, and is heated so that the temperature of the second wafer reaches approximately 350° C.

Next, the rotary shaft 21 is rotated, and the wafer loading tables 16b and 16a are stopped at positions immediately above the outgassing units 17f and 17e, respectively. Since the second wafer has already reached the temperature of approximately 350° C., it is possible to start film formation immediately. Thus, when mixed gas of TEOS-$O_3$ is discharged immediately as the reaction gas from the gas nozzles 22f and 22e and this state is maintained for about one minute, a $SiO_2$ film having a target film thickness of approximately 4,000 Å is formed on the first wafer 33 and a $SiO_2$ film having a film thickness of approximately 2,000 Å, which is about half of the target film thickness, is formed on the second wafer. In the interim, the third wafer is loaded on the wafer loading table 16c positioned at the loader/unloader 15 and the third wafer is heated to approximately 350° C.

Then, the rotary shaft 21 is rotated, and the wafer loading tables 16c, 16b and 16a are stopped at positions immediately above the outgassing units 17f, 17e and 17d, respectively. Since the third wafer has already reached the temperature of approximately 350° C. at this time, it is possible to start film formation immediately. Thus, when mixed gas of TEOS-$O_3$ and TMPO is discharged immediately as the reaction gas from the gas nozzles 22f, 22e and 22d and this state is maintained for about one minute, a PSG film having a film thickness of approximately 2,000 Å, which is about one third of the target film thickness, is formed on the first wafer 33, and a $SiO_2$ film having a target film thickness of approximately 4,000 Å is formed on the second wafer. Furthermore, a $SiO_2$ film having a film thickness of approximately 2,000 Å, which is about half of the target film thickness, is formed on the third wafer.

In this manner, the wafers are set to the wafer loading tables 16d to 16f and an insulating film composed of two layers $SiO_2$ film/PSG film is formed on each wafer in succession. Then, when the first wafer 33 returns to the loader/unloader portion 15, after having completed the circuit around the rotary shaft 21, $SiO_2$ film/PSG film having a target film thickness is formed thereon. Since the wafer temperature is always maintained at a constant temperature in the meanwhile, the stability of the wafer temperature for film formation is very high.

Next, when the elevator 37 is lifted, a signal is sent to the slip ring 29 corresponding to the chuck of the wafer loading table 16a, the solenoid valve of the suction port 18 is closed, and nitrogen gas is sent to the chuck by opening the inlet port 19 and the first wafer 33 drops from the wafer loading surface onto the elevator. Then, the first wafer 33 is carried out to the cassette station by means of the robot 14. In such a manner, the $SiO_2$ film/PSG film having a predetermined film thickness is formed on the wafers one by one and the coated wafers are accumulated in the cassette station.

As described above, according to the second embodiment, the time for loading/unloading is practically eliminated, thus making it possible to maintain a high throughput.

Further, it becomes possible to control production of individual wafers by providing a plurality of wafer loading tables 16a to 16f and separate outgassing units 17b to 17f.

Because the wafer loading tables 16a to 16f radially reciprocate in a straight-line, even if there is a deviation in the supply of the reaction gas, the reaction gas is supplied to the wafer uniformly. Further, since the heaters are moved together with the wafers, the wafer temperature is maintained always constant, thus obtaining a highly stable temperature. With this, it is possible to form a uniform film thickness and film quality on the wafer.

In the above-mentioned method for manufacturing a semiconductor device, an insulating film composed of two layers is formed by using two types of reaction gases. As shown in FIG. 9(a), however, it is also possible to form a single film on the wafer while the wafer goes around by use of only one type of reaction gas.

Further, as shown in FIG. 9(b), it is also possible to form a single film by a method similar to a batch system in that films are formed simultaneously on the wafers 40 to 44 using one type of reaction gas, after setting wafers in advance on all the wafer loading tables 16a to 16f.

(b) The Third Embodiment

Figure 6:
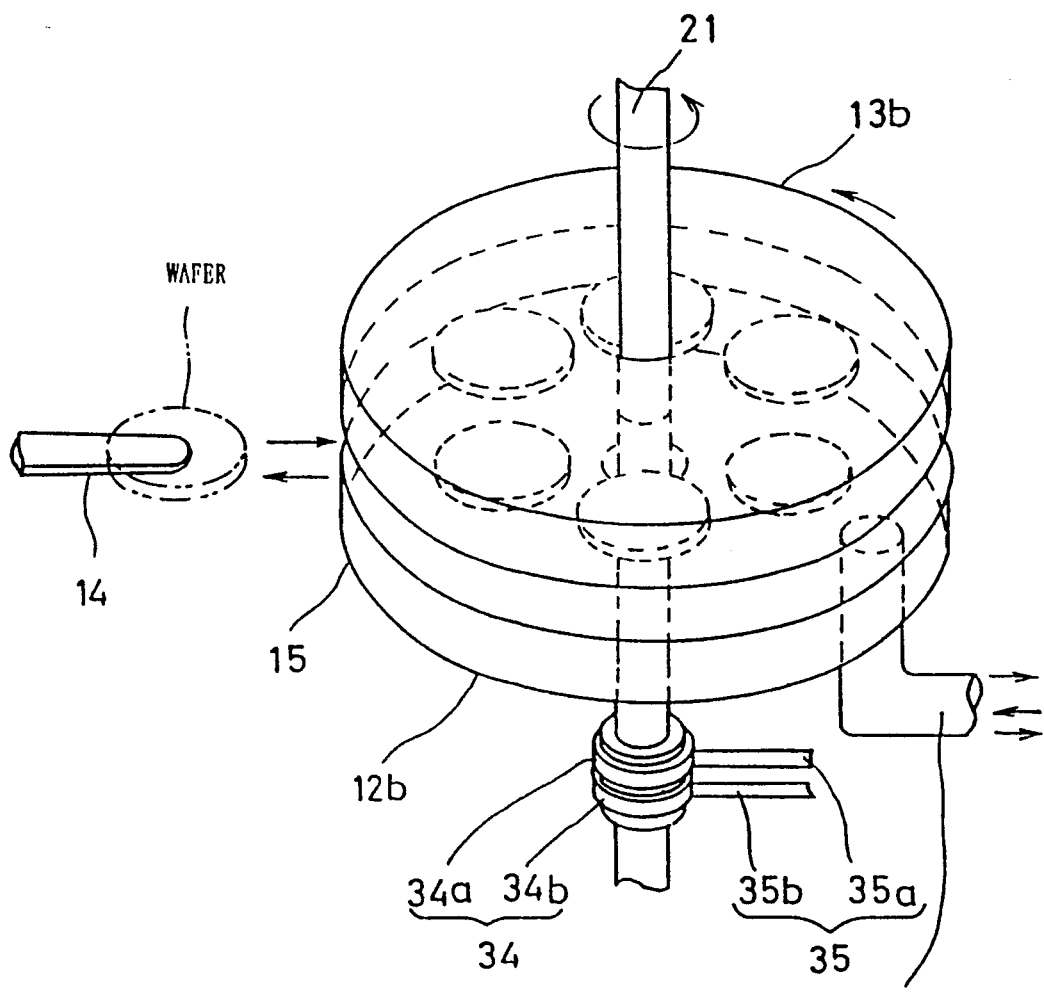
FIG. 6 is a perspective view of the combination of a gas dispersion unit and a wafer holder in a third embodiment of the present invention.

FIG. 6 is a perspective view showing in detail the configuration of the gas dispersion unit/wafer holder in the third embodiment of the present invention, which is used for the CVD apparatus shown in FIG. 1. The configuration includes a combination of a block outgassing unit 12b and block wafer holder 13b shown in FIG. 7(b).

In FIG. 6, a disc wafer holder 13b is fixed to the rotary shaft 21 at the central part of the disc, and the disc surface around the rotary shaft 21 serves as a wafer loading surface on which a plurality of wafers can be loaded facing downward. A single heater is embedded in the top of this wafer loading surface so as to surround the rotary shaft 21. As in the previous embodiments, the wafers on the wafer loading surface are heated and thermally insulated by the heater. A disc gas dispersion unit 12b is fixed to the base 26 spaced from the rotary shaft 21 and the wafer holder 13b and facing the wafer loading surface of the wafer holder 13b, and radial slits are provided for outgassing in the area opposing to the wafer loading surface. Further, in order to gather the reaction gas discharged from the outgassing slits, a gas collector resembling that shown in FIG. 3(b) is provided around the circumferential portion of the outgassing slits. A robot 14 loads a wafer on the wafer loading surface of the wafer holder 13b which has arrived at the position of the loader/unloader 15 and removes the wafer which has arrived at the position of the loader/unloader 15.

In the apparatus for manufacturing a semiconductor device in the third embodiment of the present invention, the time for loading/unloading is practically eliminated, thus making it possible to maintain a high throughput.

Further, since it is possible to move the heater together with the wafer, the wafer temperature is maintained always constant, thus resulting in high stability of the temperature. With this, it is possible to form a film having uniform film thickness and film quality on the wafer.

Figure 8E:
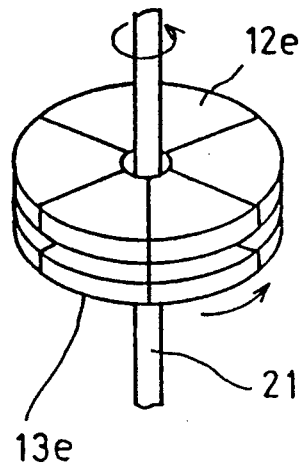
FIGS. 8(e), 8(f), 8(g) and 8(h) are a series of perspective views providing schematic configurations for the combined gas dispersion unit and wafer holder of the sixth to the ninth embodiments of the present invention.
Figure 8F:
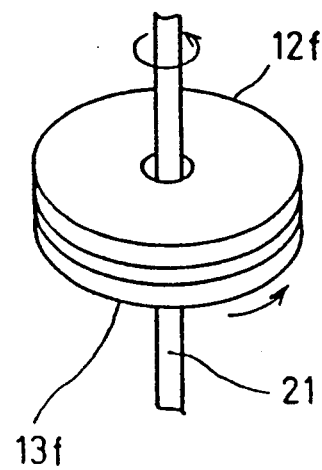

While the wafer loading surface faces downward in the above-mentioned third embodiment, the present invention is also applicable to an arrangement having the wafer loading surface facing upward as shown in FIG. 8(f), i.e. a fifth embodiment.

A method for forming a single CVD $SiO_2$ film on the wafer using the above-mentioned CVD apparatus will be described with reference to FIG. 1, FIG. 2, FIG. 6 and FIG. 9(b). In this case, as shown in FIG. 9(b), a plurality of wafers are loaded in advance on the wafer holder 13b at the same time, and a single CVD $SiO_2$ film having a predetermined film thickness is formed while the wafer holder 13b goes around the rotary shaft. Such a method resembles forming a film by batch processing.

In FIG. 9(b), "A" indicates a target film thickness for the CVD $SiO_2$ film. Further, an arrangement wherein oscillation units are not provided will be described in the present embodiment.

First, a signal is sent to the slip ring 29 corresponding to the chuck of each wafer loading surface, five sheets of wafers 40 to 44 are carried to the loader/unloader and loaded on the wafer loading surface of the wafer holder 13f in consecutive order, by means of the robot 14, while exhausting the as from the suction port 18 by opening the solenoid valve, and respective wafers 40 to 44 are fixed to the wafer loading surface in this manner. Furthermore, electric power is supplied to the heater so as to heat the wafers 40 to 44 on the wafer loading surface.

Next, after the temperature of the respective wafers has reached approximately 350° C., a mixed gas of $TEOS-O_3$ is discharged as the reaction gas from the nozzles of the gas dispersion unit 12b, and the rotary shaft 21 is rotated at a speed of one revolution in about one minute while maintaining the wafer temperature at approximately 350° C. Now, when the film formation rate is set to approximately 2,000 Å/min, a CVD $SiO_2$ film having a target film thickness of approximately 8,000 Å is formed uniformly on respective wafers 40 to 44, after the rotary shaft 21 goes around four times.

Next, after the reaction gas supplied to the gas dispersion unit 12 is stopped, the wafers 40 to 44 removed one by one from the wafer holder 13b by a procedure which is the reverse of the loading of the wafers 40 to 44. In other words, a signal is sent to the slip ring 29 corresponding to the chuck of the wafer holder 13b to close the solenoid valve of the suction port 18, and at the same time, the valve of the nitrogen gas inlet port 19 is opened to send the nitrogen gas to the chuck. Thus, respective wafers 40 to 44 are unloaded from the wafer loading surface, and carried out to the cassette station in consecutive order by means of the robot 14. It is thus possible to form CVD $SiO_2$ films having a predetermined film thickness on the wafers 40 to 44, one at a time.

As described above, according to the method of forming a CVD $SiO_2$ film using the CVD apparatus of the third embodiment, the throughput is limited because time is required for loading/unloading. Since only one system will suffice for power supply to the feed pipings of the reaction gas and the heaters, however, operation and maintenance of the apparatus can be performed easily.

Again, because the heater is moved together with the wafer the wafer temperature is maintained always constant and stability of the temperature is high. With this, it is possible to form a film having uniform film thickness and film quality on a wafer.

Incidentally, according to the above-mentioned method for manufacturing a semiconductor device, the films are formed by a method resembling a batch system in which the films are formed on the wafers 40 to 44 simultaneously after setting the wafers 40 to 44 in advance on all the wafer loading surfaces of the wafer holder 13. However, it is also possible to set the wafers on the wafer holder 13b in consecutive order and to form a film having a predetermined film thickness while the wafer goes around the rotary shaft 21 as shown in FIG. 9(a).

Figure 7C:
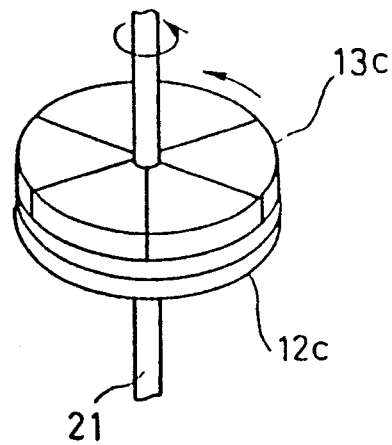
Figure 7D:
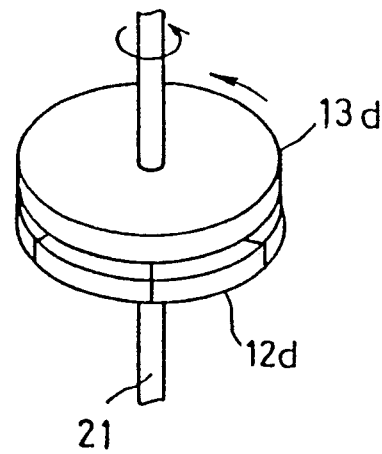
Figure 8G:
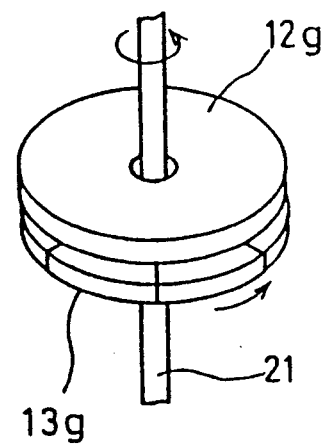
Figure 8H:
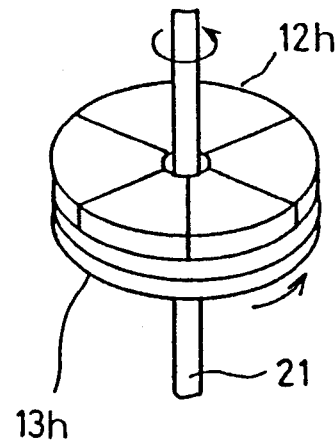

Further, it is also possible to use block gas dispersion units 12c, 12g/individual wafer holders 13c, 13g and individual gas dispersion units 12d, 12h/block wafer holders 13d, 13h shown in FIGS. 7(c) and (d) and FIGS. 8(g) and (h) by combining gas dispersion units and wafer holders in the second and the third embodiments as in the 6th to the 9th embodiments. By doing so, it is possible to form a film by a method suited to formation of a particular film.

Furthermore, while the apparatus of the present invention is described above as applied to film formation under atmospheric pressure, it may also be applied to film formation under reduced pressure by a plasma CVD method and the like.

Industrial Availability

As described above, an apparatus for manufacturing a semiconductor device according to the present invention is useful as an apparatus for forming a film such as a continuous type automated CVD apparatus. In particular, it is suitable for forming films continuously while preventing variation of the wafer temperature while the wafers are being moved and for controlling production of individual wafers and formation of multi-layer films of different types.

We claim:

1. An apparatus for manufacturing a semiconductor device comprising:
   a wafer-holder providing a plurality of wafer loading surfaces;
   a rotary shaft for supporting and rotating said wafer holder so that said wafer loading surfaces rotate in a circle and in a single plane;
   a gas dispersion unit mounted separate from and facing said wafer loading surfaces of said wafer holder;
   at least one heater for heating said wafer holder;
   a first pair of electrical contacts electrically connected to said heater and mounted on said rotary shaft; and
   a second pair of electrical contacts connected to a power source and in sliding contact with said first pair of electrical contacts so that the rotation of said rotary shaft is not obstructed.

2. An apparatus for manufacturing a semiconductor device according to claim 1, wherein said wafer holder has a disc configuration, and said plurality of wafer loading surfaces are provided around the circumference of said disc.

3. An apparatus for manufacturing a semiconductor device according to claim 1, wherein said wafer holder is composed of a plurality of separate wafer loading tables provided, said wafer loading tables providing said wafer loading surfaces arranged in a circle around said rotary shaft.

4. An apparatus for manufacturing a semiconductor device according to claim 3, further comprising means for moving the wafer loadings tables reciprocably in a straight line and in a radial direction with respect to said shaft.

5. An apparatus for manufacturing a semiconductor device according to claim 1, wherein said gas dispersion unit comprises a plurality of separate gas collectors and means for supplying reaction gas independently to each of said separate gas collectors.

6. An apparatus for manufacturing a semiconductor device according to claim 2, wherein said gas dispersion unit comprises a plurality of separate gas collectors and means for supplying reaction gas independently to each of said separate gas collectors.

7. An apparatus for manufacturing a semiconductor device according to claim 3, wherein said gas dispersion unit comprises a plurality of separate gas collectors and means for supplying reaction gas independently to each of said separate gas collectors.

8. An apparatus for manufacturing a semiconductor device according to claim 4, wherein said gas dispersion unit comprises a plurality of separate gas collectors and means for supplying reaction gas independently to each of said separate gas collectors.

* * * * *